(12) United States Patent
Damle et al.

(10) Patent No.: US 8,705,290 B2
(45) Date of Patent: *Apr. 22, 2014

(54) MEMORY DEVICE HAVING IMPROVED PROGRAMMING OPERATION

(75) Inventors: Prashant S. Damle, Santa Clara, CA (US); Krishna K. Parat, Palo Alto, CA (US); Alessandro Torsi, Avezzano (IT); Carlo Musilli, Avezzano (IT); Kalpana Vakati, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/621,052

(22) Filed: Sep. 15, 2012

(65) Prior Publication Data
US 2013/0016569 A1      Jan. 17, 2013

Related U.S. Application Data

(60) Continuation of application No. 13/193,192, filed on Jul. 28, 2011, now Pat. No. 8,331,160, which is a division of application No. 12/402,158, filed on Mar. 11, 2009, now Pat. No. 7,990,772.

(51) Int. Cl.
*G11C 11/34* (2006.01)

(52) U.S. Cl.
USPC ............ 365/185.26; 365/185.18; 365/189.11; 365/185.27

(58) Field of Classification Search
USPC ............. 365/185.26, 185.18, 189.11, 185.05, 365/185.19, 185.23, 189.16, 204, 230.06
See application file for complete search history.

(56) References Cited

U.S. PATENT DOCUMENTS

| | | | |
|---|---|---|---|
| 6,621,735 B2* | 9/2003 | Nakamura et al. | ....... 365/185.17 |
| 7,800,154 B2 | 9/2010 | Noguchi et al. | |
| 7,990,772 B2 | 8/2011 | Damle et al. | |
| 8,331,160 B2 | 12/2012 | Damle et al. | |
| 2005/0105359 A1 | 5/2005 | Matsunaga | |
| 2005/0265078 A1 | 12/2005 | Lee | |
| 2006/0091470 A1 | 5/2006 | Noguchi et al. | |
| 2007/0147131 A1 | 6/2007 | Tran et al. | |
| 2008/0113479 A1 | 5/2008 | Mokhlesi | |
| 2008/0165579 A1 | 7/2008 | Lee | |
| 2008/0183951 A1 | 7/2008 | Lee et al. | |
| 2009/0040832 A1 | 2/2009 | Park | |

(Continued)

FOREIGN PATENT DOCUMENTS

| | | |
|---|---|---|
| CN | 102349112 A | 2/2012 |
| TW | 201037714 A1 | 10/2010 |
| WO | WO-2010104971 A1 | 9/2010 |

OTHER PUBLICATIONS

"U.S. Appl. No. 12/402,158 Non-Final Office Action mailed Oct. 6, 2010", 14.

(Continued)

*Primary Examiner* — Fernando Hidalgo
(74) *Attorney, Agent, or Firm* — Schwegman, Lundberg & Woessner, P.A.

(57) ABSTRACT

Some embodiments include methods and devices having a module and memory cells. The module is configured to reduce the amount of electrons in the sources and drains of the memory cells during a programming operation.

20 Claims, 7 Drawing Sheets

(56) References Cited

U.S. PATENT DOCUMENTS

2010/0232234 A1 9/2010 Damle et al.
2011/0280085 A1 11/2011 Damle et al.
2012/0063238 A1 3/2012 Horesh et al.

OTHER PUBLICATIONS

"U.S. Appl. No. 12/402,158 Restriction Requirement mailed Aug. 5, 2010", 2 pgs.

"U.S. Appl. No. 12/402,158, Examiner Interview Summary mailed Mar. 10, 2011", 1 pg.

"U.S. Appl. No. 12/402,158, Notice of Allowance mailed Mar. 10, 2011", 10 pgs.

"U.S. Appl. No. 12/402,158, Response filed 09-07-10 to Restriction Requirement mailed Aug. 5, 2010", 8 pgs.

"U.S. Appl. No. 12/402,158, Response filed Jan. 6, 2011 to Non Final Office Action mailed Oct. 6, 2010", 12 pgs.

"U.S. Appl. No. 13/193,192 , Response filed Jul. 23, 2012 to Non Final Office Action mailed Mar. 22, 2012", 8 pgs.

"U.S. Appl. No. 13/193,192, Non Final Office Action mailed Mar. 22, 2012", 12 pgs.

"U.S. Appl. No. 13/193,192, Notice of Allowance mailed Aug. 9, 2012", 8 pgs.

"International Application No. PCT/US2010/026854, International Preliminary Report on Patentability mailed Sep. 22, 2011", 8 pgs.

"International Application Serial No. PCT/US2010/026854, Search Report mailed Jun. 4, 2010", 7 pgs.

"International Application Serial No. PCT/US2010/026854, Written Opinion mailed Jun. 4, 2010", 5 Pgs.

\* cited by examiner

MEMORY DEVICE HAVING IMPROVED PROGRAMMING OPERATION

PRIORITY APPLICATIONS

This application is a continuation of U.S. application Ser. No. 13/193,192, filed Jul. 28, 2011, which is a divisional of U.S. application Ser. No. 12/402,158, filed Mar. 11, 2009, now issued as U.S. Pat. No. 7,990,772, which are both incorporated herein by reference in their entirety.

BACKGROUND

Memory devices are widely used in computers and other electronic devices to store data and other information. Some memory devices, such as a flash memory device, do not need power to maintain the information stored in the device.

A flash memory device usually has a programming operation to store information, a read operation to retrieve the stored information, and an erase operation to clear some or all of the information in the device. Programming, read, and erase operations in a flash memory device usually involve applying different voltages to various components of the device.

A conventional flash memory device goes through many programming, read, and erase operations during its life. Therefore, improper control of the voltages applied during these operations may lead to inferior device performance, reliability, or both.

DETAILED DESCRIPTION

Figure 1:
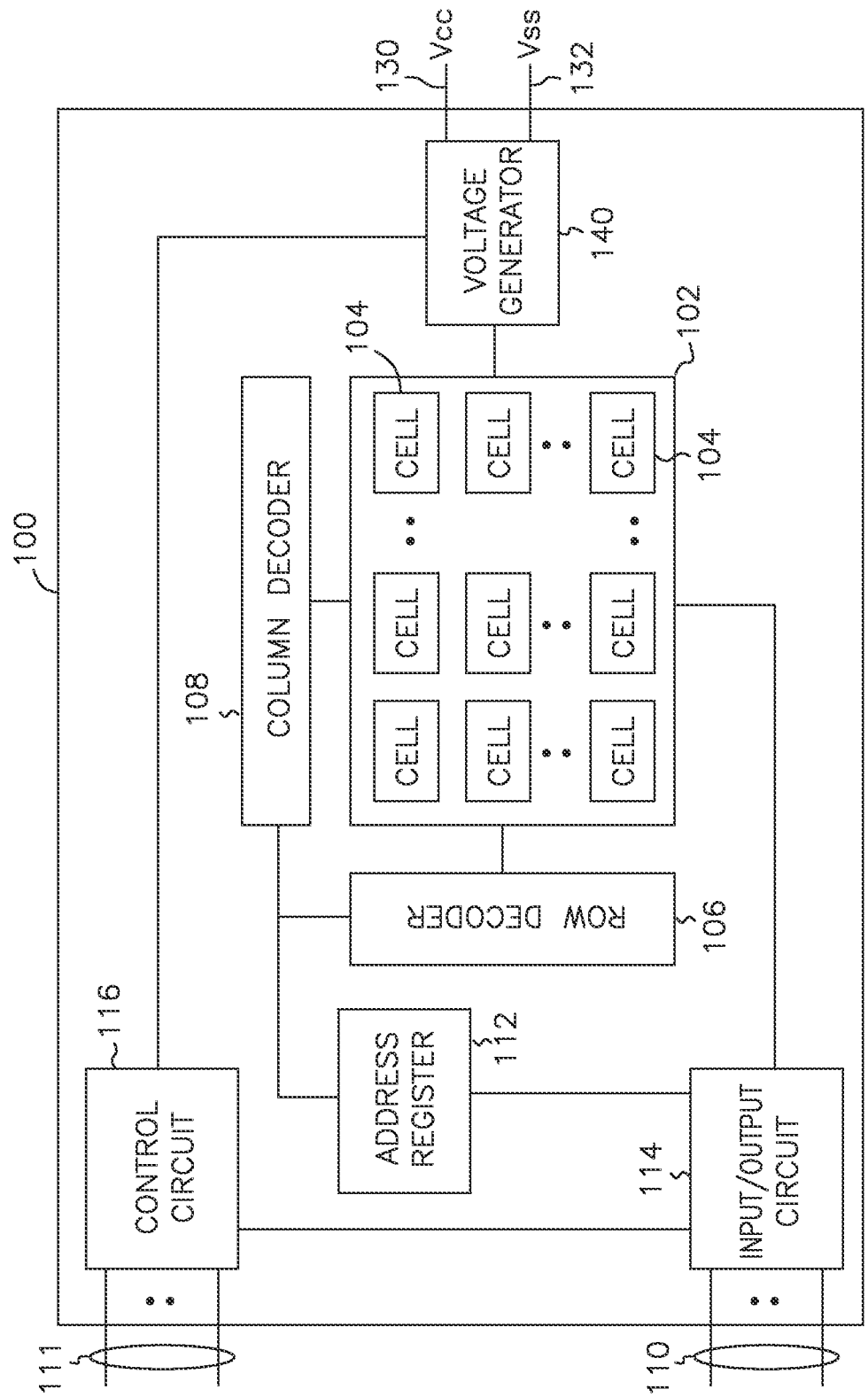
FIG. 1 shows a block diagram of a memory device having a memory array with memory cells, according to an embodiment of the invention.

FIG. 1 shows a block diagram of a memory device 100, according to an embodiment of the invention. Memory device 100 includes a memory array 102 with memory cells 104 arranged in rows and columns. Row decoder 106 and column decoder 108 respond to an address register 112 and access memory cells 104 based on row address and column address signals on lines 110. A data input/output circuit 114 transfers data between memory cells 104 and lines 110. A control circuit 116 controls operations of memory device 100 based on signals on lines 110 and 111. Memory device 100 can be a non-volatile memory device. For example, memory device 100 can be a NAND flash memory device where memory cells 104 include flash memory cells arranged in a NAND flash memory arrangement. One skilled in the art will readily recognize that memory device 100 includes other parts, which are omitted from FIG. 1 to focus on the various embodiments described herein.

Memory device 100 includes lines 130 and 132 to receive voltages Vcc and Vss. Vcc can be the supply voltage for memory device 100, Vss can be ground. Memory device 100 also includes a voltage generator 140. Voltage generator 140 and control circuit 116 may act separately or together as a module or as a part of a module to provide different voltages to memory array 102 (e.g., to cause memory array 102 to have different voltages) during various operations of memory device 100. The operations include a programming operation to transfer (e.g., write) data from lines 110 to memory cells 104, a read operation to transfer (e.g., read) data from memory cells 104 to lines 110, and an erase operation to erase (e.g., clear) data from all or a portion of memory cells 104. Memory device 100 includes embodiments of the devices described below with reference to FIG. 2 through FIG. 7.

Figure 2:
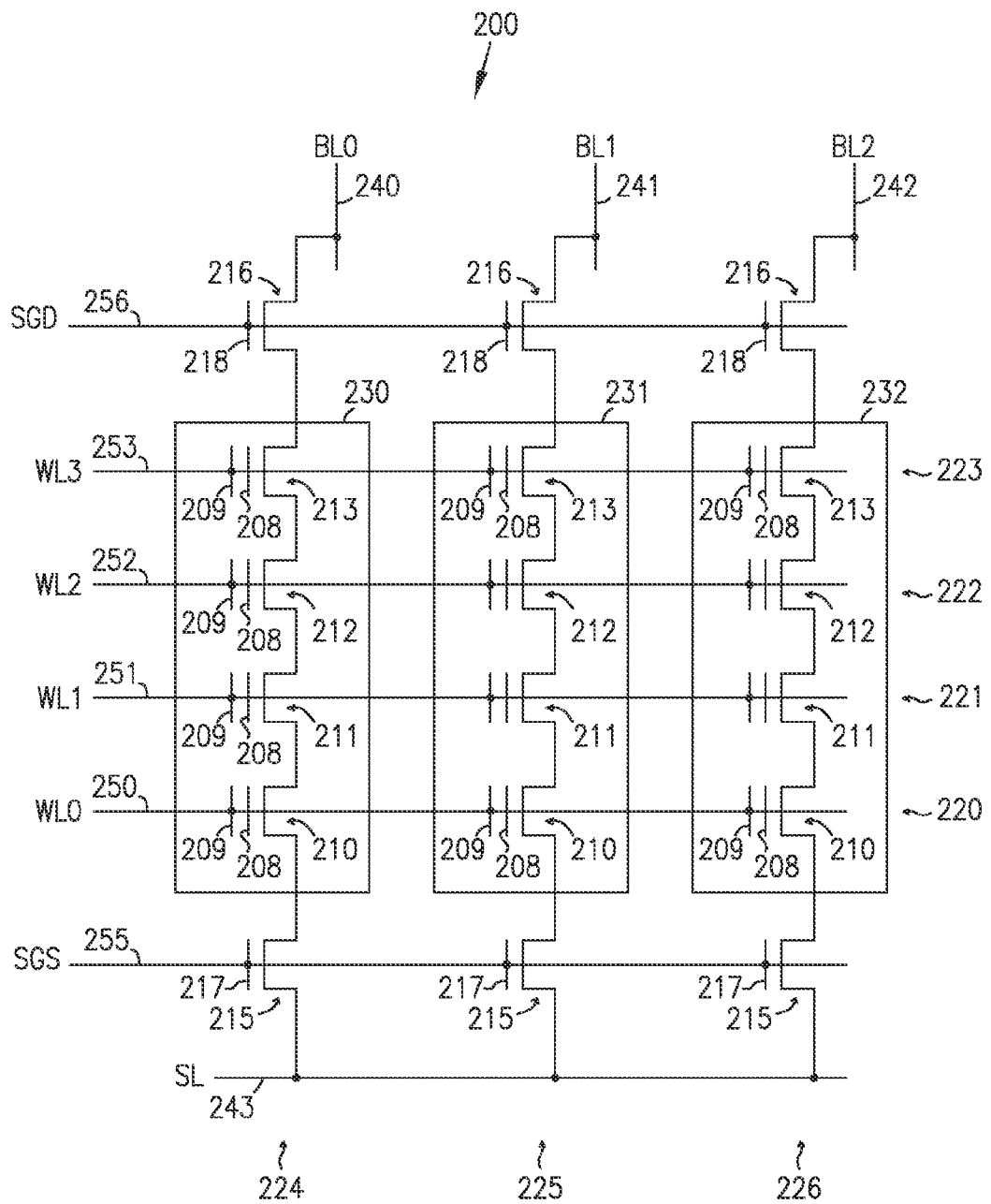
FIG. 2 shows a partial schematic diagram of a memory device, according to an embodiment of the invention.

FIG. 2 shows a partial schematic diagram of a memory device 200, according to an embodiment of the invention. Memory device 200 includes memory cells 210, 211, 212, and 213 arranged in rows 220, 221, 222, and 223, and columns 224, 225, and 226. The memory cells in the same column are connected in a string of memory cells, such as strings 230, 231, and 232. FIG. 2 shows an example of three strings and each string has four memory cells. However, the number of strings and memory cells in each string may vary.

Memory device 200 also includes select transistors 215 and 216. Each select transistor 215 is coupled between one of strings 230, 231, and 232 and a source line 243 associated with a source line signal SL. Each select transistor 215 includes a gate 217 coupled to a select line 255. A select signal SGS on select line 255 is used to activate (turn on) select transistors 215 to electrically couple strings 230, 231, and 232 to source line 243. Each transistor 216 is coupled between one of strings 230, 231, and 232 and one of bit lines 240, 241, and 242 associated with bit line signals BL0, BL1, and BL2, respectively. Each select transistor 216 includes a gate 218 coupled to a select line 256. A select signal SGD on select line 256 is used to activate select transistors 216 to electrically couple strings 230, 231, and 232 to bit lines 240, 241, and 242. FIG. 2 shows select transistors 215 and 216 being outside strings 230, 231, and 232. However, transistors 215 and 216 can also be viewed as part of these strings, such that each of strings 230, 231, 232 can also include a corresponding select transistor 215 and a corresponding select transistor 216. For example, string 231 also includes a select transistor 215 and a select transistor 216 that are coupled between bit line 241 and source line 255, respectively.

As shown in FIG. 2, each of memory cells 210, 211, 212, and 213 includes a floating gate 208 and a control gate 209. Control gates 209 of memory cells (e.g., memory cells 210) in the same row (e.g., row 220) are coupled to the same word line, such as word line 250, 251, 252, or 253. Word lines signals WL0, WL1, WL2, and WL3 on word lines 250, 251, 252, and 253 are used to access memory cells 210, 211, 212, and 213.

To program, read, or erase memory cells 210, 211, 212, and 213, memory device 200 applies various voltages to select lines 255 and 256, word lines 250, 251, 252, and 253, bit lines 240, 241, and 242, and source line 243. To focus on the embodiments herein, this description omits details of read and erase operations of memory device 200.

Figure 3:
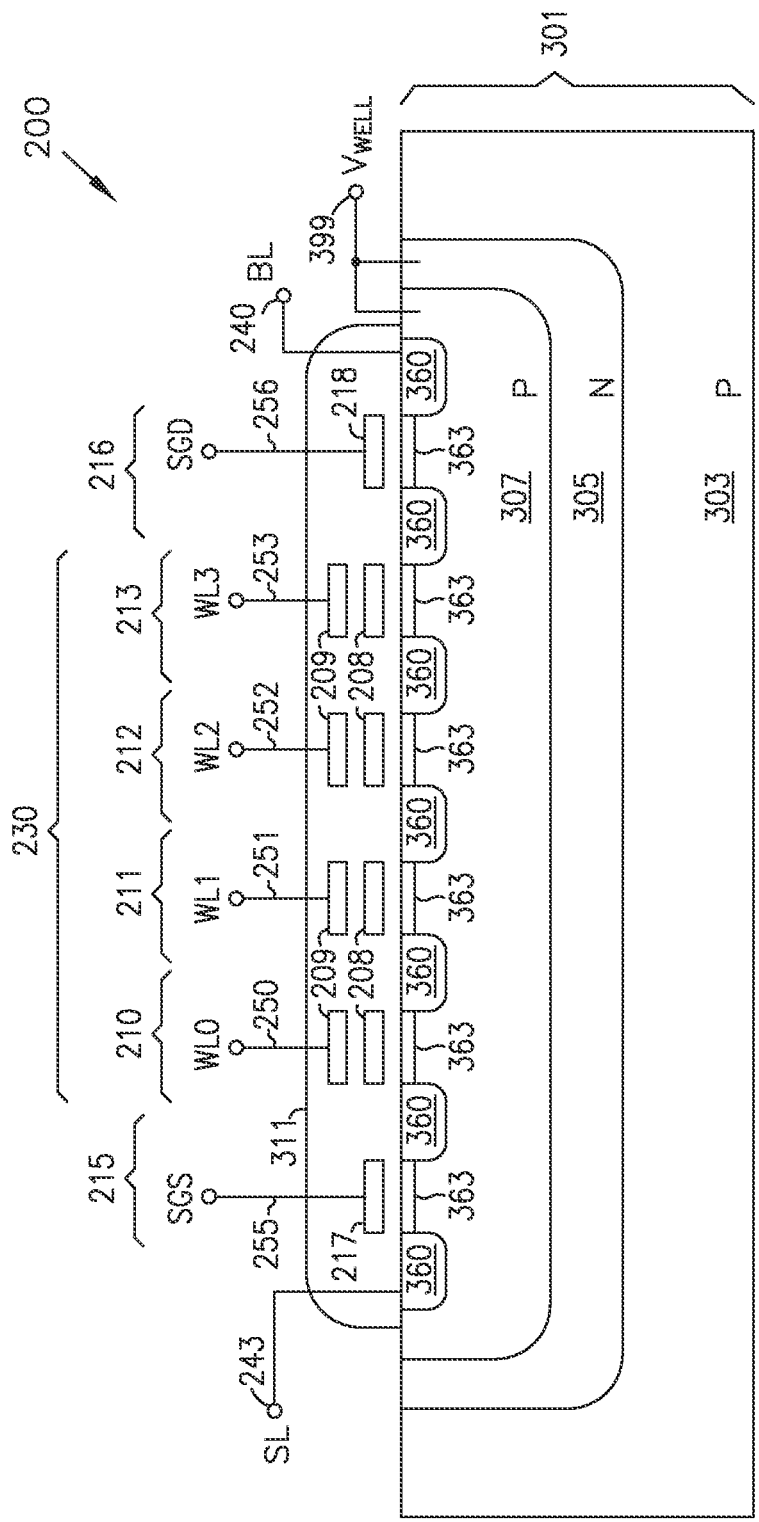
FIG. 3 shows a partial cross-section of the memory device of FIG. 2, according to an embodiment of the invention.

In a programming operation, in addition to various voltages that memory device 200 applies to select lines 255 and 256, word lines 250, 251, 252, and 253, bit lines 240, 241, and 242, and source line 243, as mentioned above, memory device 200 also applies a voltage to a semiconductor substrate where memory cells 210, 211, 212, and 213 are formed. FIG. 3 shows an example of a semiconductor substrate of memory device 200.

FIG. 3 shows a partial cross-section of memory device 200 of FIG. 2, according to an embodiment of the invention. As show in FIG. 3, memory device 200 includes a substrate 301 with substrate portions that can be called wells 303, 305, and 307. Well 305 and well 307 of substrate 301 are coupled to a node 399. Memory device 200 applies a well voltage $V_{WELL}$ to wells 305 and 307 through node 399 during a programming operation. Designations "P" and "N" in FIG. 3 indicate materials of different conductivity types in various portions of substrate 301. For example, the P-type material can be silicon doped with first impurities and the N-type material can be silicon doped with second impurities different from the first impurities. The impurities in the P-type material can include material such as boron. The impurities in the N-type material can include material such as phosphorus or arsenic.

As shown in FIG. 3, in each of memory cells 210, 211, 212, and 213, floating gate 208 are isolated from each other by an insulating material 311 and are formed above regions 360 and regions 363. Regions 360 include an N-type material different from the P-type material of well 307. Each of regions 360 corresponds to sources and drains of transistors 215 and 216 and sources and drains of transistors of memory cells 210, 211, 212, and 213. Each of regions 363 correspond to a channel between two regions 360. Regions 360 and regions 363 can form a continuous conductive path between bit line 240 and source line 243 to conduct current during various operations of memory device 200.

Regions 360 and regions 363 are collectively called S-D region. In this description, an S-D region refers to a region that includes sources and drains (e.g., 360) and the channels (e.g., 363) between the sources and drains of select transistors (e.g., 215 and 216) and memory cells (e.g., 210, 211, 212, and 213).

FIG. 3 shows a partial cross-section of only one string of memory cells (e.g., string 230) of memory device 200. Other strings of memory cells (e.g., strings 231 and 232 in FIG. 2) have a structure similar to or identical to the structure shown in FIG. 3.

In a programming operation, memory device 200 selects one or more memory cells to program information into the selected memory cell (or cells). In this description, a selected memory cell is the memory cell that is selected to be programmed during a particular programming operation. A selected string is the string that includes a selected memory cell during a particular programming operation. An unselected (or inhibited) string is the string that does not include a selected memory cell during a particular programming. An unselected memory cell is a memory cell that is not selected to be programmed during a particular programming operation. Thus, a selected string may include both selected and unselected memory cells, and an unselected string may include only unselected memory cells.

During a programming operation, one or more unselected strings in memory device 200 may be disturbed during a programming operation because of the effect of different voltage levels applied to different components of the selected and unselected strings. Electrons in regions 360 and 363 of unselected strings may contribute to the programming disturbance of the unselected strings. To decrease or suppress programming disturbance that may happen to the unselected strings, memory device 200 reduces an amount of electrons in regions 360 and 363 (S-D region) of the unselected strings.

In an embodiment, memory device 200 reduces an amount of electrons from regions 360 and 363 by partially or completely removing free electrons from regions 360 and 363. For example, during a programming operation, memory device 200 applies a voltage from regions 360 and 363 to well 307 and stay therein or move out through node 399, thereby partially or completely removing free electrons from regions 360 and 363.

The operation of memory device 200 of FIG. 2 and FIG. 3 is similar to or identical to that of a memory device described below with reference to FIG. 4 through FIG. 7.

Figure 4:
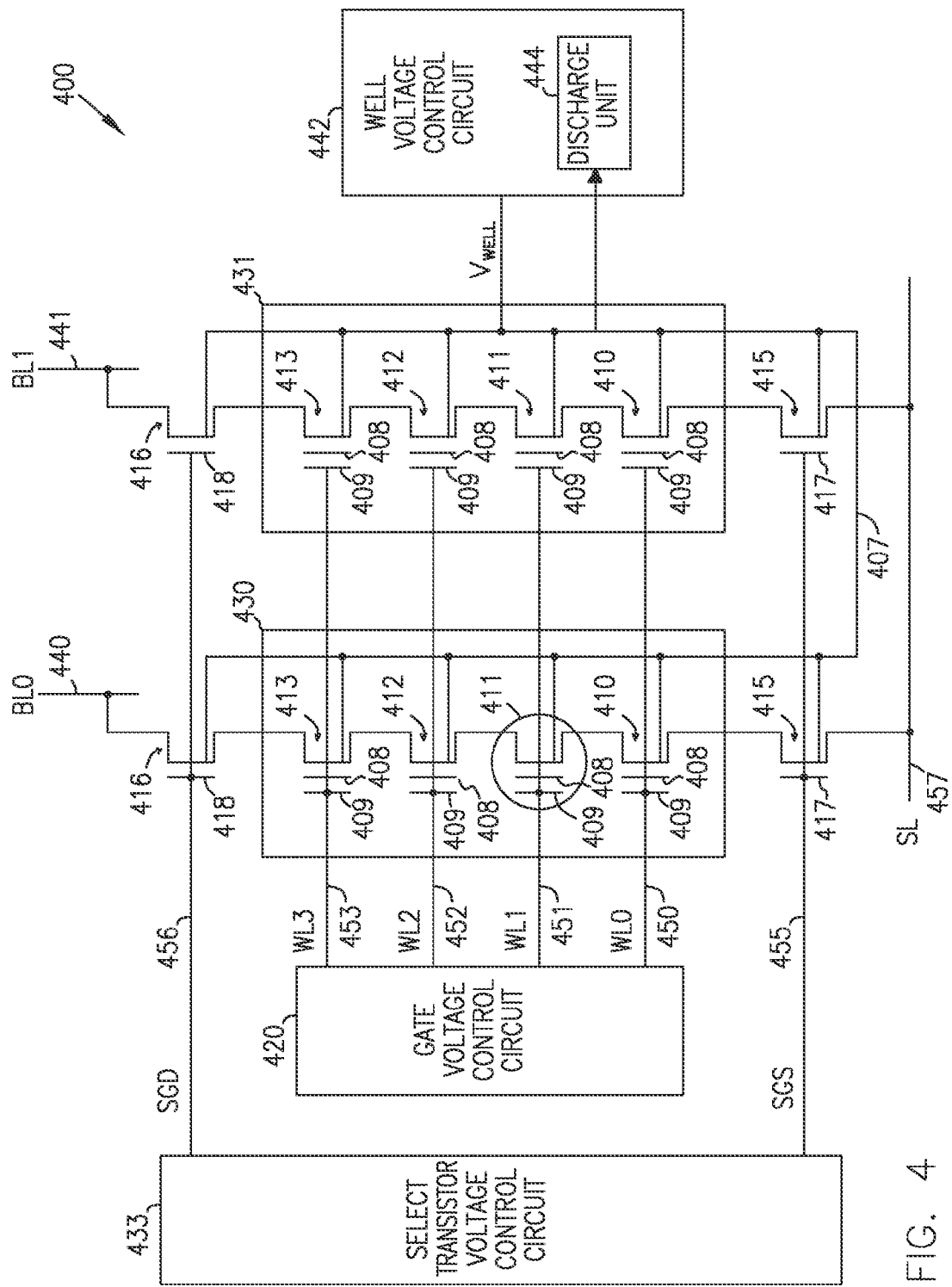
FIG. 4 shows a partial schematic diagram of a memory device including a memory cell selected to be programmed during an example programming operation, according to an embodiment of the invention.

FIG. 4 shows a partial schematic diagram of memory device 400 including a memory cell 411 selected to be programmed during an example programming operation, according to an embodiment of the invention. Memory device 400 includes strings 430 and 431, each having memory cells 410, 411, 412, and 413 with control gates 409 and floating gates 408. Each of strings 430 and 431 is coupled to a corresponding bit line 440 or 441 via a select transistor 416 and to a source line 457 via a select transistor 415. Bit lines 440 and 441 are associated with bit line signals BL0 and BL1, respectively.

Control gates 409 of memory cells 410, 411, 412, and 413 are coupled to respective word lines 450, 451, 452, and 453 associated with word lines signals WL0, WL1, WL2, and WL3. Word lines 450, 451, 452, and 453 are conductive lines used to access memory cells 410, 411, 412, and 413. Each select transistor 415 includes a gate 417 coupled to a select line 455 associated with a select signal SGS. Each select transistor 416 includes a gate 418 coupled to a select line 456 associated with a select signal SGD.

Memory cells 410, 411, 412, and 413 of both strings 430 and 431 and select transistors 415 and 416 are coupled to lines 407. Lines 407 represent a portion of a semiconductor substrate, for example, a well in the substrate, of memory device 400. Thus, lines 407 are also referred to as a portion (e.g., well 407) of memory device 400. Well 407 can have a structure that is similar or identical to one or more of well 305 and well 307 of substrate 301 of FIG. 3. Thus, each of strings 430 and 431 can also have an S-D region similar to the S-D region (regions 360 and 363) of FIG. 3.

As shown in FIG. 4, memory device 400 also includes a gate voltage control circuit 420 to control the voltage levels of WL0, WL1, WL2, and WL3. A select transistor voltage control circuit 433 controls the voltage levels of SGS and SGD. A well voltage control circuit 442 controls the voltage level of well 407. During a time interval of programming operation, such as a time interval before a selected memory cell is programmed, well voltage control circuit 442 applies voltage $V_{WELL}$ to well 407 to charge well 407 to a voltage level greater than the voltage levels at of WL0, WL1, WL2, and WL3 to cause electrons to move from the S-D region of strings 430 and 431 to well 407. During another time interval of the programming operation, such as a time interval after well 407 is charged, well voltage control circuit 442 disconnects voltage $V_{WELL}$ from well 407 to discharge well 407, using a discharge unit 444, so that one or more selected memory cells can be programmed.

FIG. 4 shows an example where memory device 400 includes three separate circuits 420, 434, and 442. These circuits, however, can be separated into more than three circuits, combined into fewer circuits or into a single circuit, or may be at least a part of one or both of a voltage generator and a control circuit, such as voltage generator 140 and control circuit 116 of FIG. 1.

FIG. 4 shows memory device 400 with two strings 430 and 431 to focus on the embodiments described herein. Memory device 400, however, includes numerous strings similar to or identical to strings 430 and 431 shown in FIG. 4.

During a programming operation, memory device 400 may select one or more of memory cells 410, 411, 412, and 413 in string 430 or string 431 to be selected memory cell or cells. FIG. 4 shows a dashed circle around memory cell 411 of string 430 to indicate that, in a particular example programming operation, memory cell 411 of string 430 is a selected memory cell and memory cells 410, 412, and 413 of string 430 are unselected memory cell. Thus, string 430 is a selected string. Memory cells 410, 411, 412, and 413 of string 431 are unselected memory cells. Thus, string 431 is an unselected string. A programming operation of memory device 400 is described below with reference to both FIG. 4 and FIG. 5.

In the description herein, when $V_{WELL}$ is mentioned in the text or in the drawings, it may refer to a voltage signal that is applied to a well or refer to the voltage level of the well. When BL0 and BL1 are mentioned the text or in the drawings, they may refer to the signals on two corresponding bit lines, the voltage levels on the bits lines, or the bit lines themselves. When WL0, WL1, WL2, and WL3 are mentioned the text or in the drawings, they may refer to the signals on corresponding word lines, the voltage levels on the corresponding word lines, the word lines themselves, the voltage levels on the gates of the memory cells associated with WL0, WL1, WL2, and WL3, or the gates of the memory cells associated with WL0, WL1, WL2, and WL3. Further, when SGS (or SGD) is mentioned the text or in the drawings, it may refer to the signal on a select line, a voltage level of the select line, or the select line itself. Moreover, when SL is mentioned the text or in the drawings, it may refer to the signal on a source line, a voltage level of the source line, or the source line itself.

Figure 5:
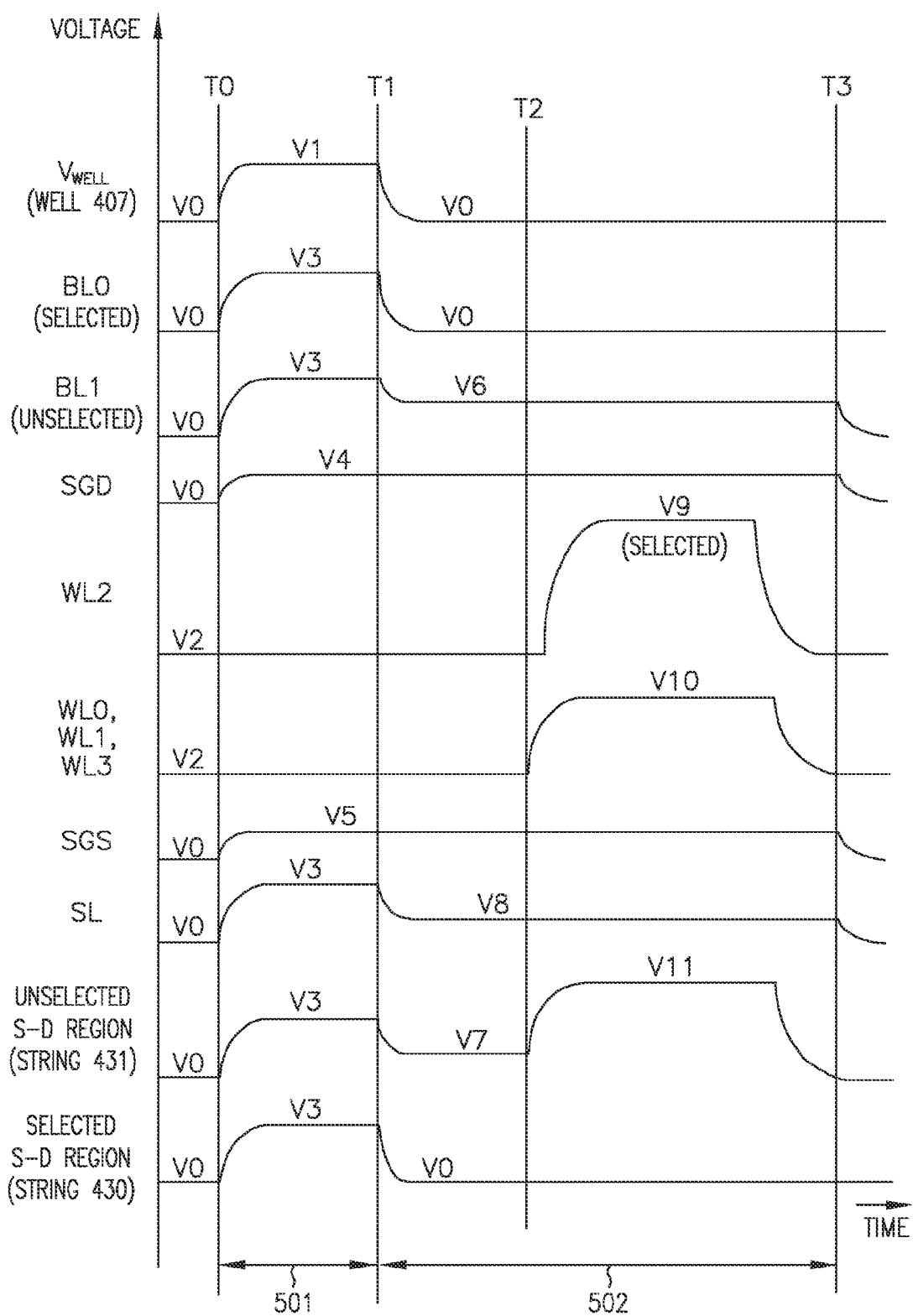
FIG. 5 is an example timing diagram of various signals for FIG. 4 during a programming operation, according to an embodiment of the invention.

FIG. 5 is an example timing diagram of various signals for FIG. 4 during a programming operation, according to an embodiment of the invention. As shown in FIG. 5, a programming operation of memory device 400 includes two different time intervals: a time interval 501 between times T0 and T1 and a time interval 502 between times T1 and T3. Voltage levels V0 through V11 represent different voltage levels of various components of memory device 400 at different times. The following description refers to both FIG. 4 and FIG. 5.

in operation, during time interval 501, memory device 400 applies $V_{WELL}$ to well 407 to raise the voltage at well 407 from a voltage level V0 to a higher voltage level V1. Memory device 400 holds WL0, WL1, WL2, and WL3 at voltage level V2, such that V1 is greater than V2. The higher voltage level V1 at well 407 relative to the voltage level V2 at WL0, WL1, WL2, and WL3 causes electrons to move from the S-D region of strings 430 and 431 to well 407. V2 can be equal to V0. V0 and V2 can be zero volts (e.g., ground potential). V2 can have another value that is different from zero. For example, V2 can have a negative value.

Figure 6:
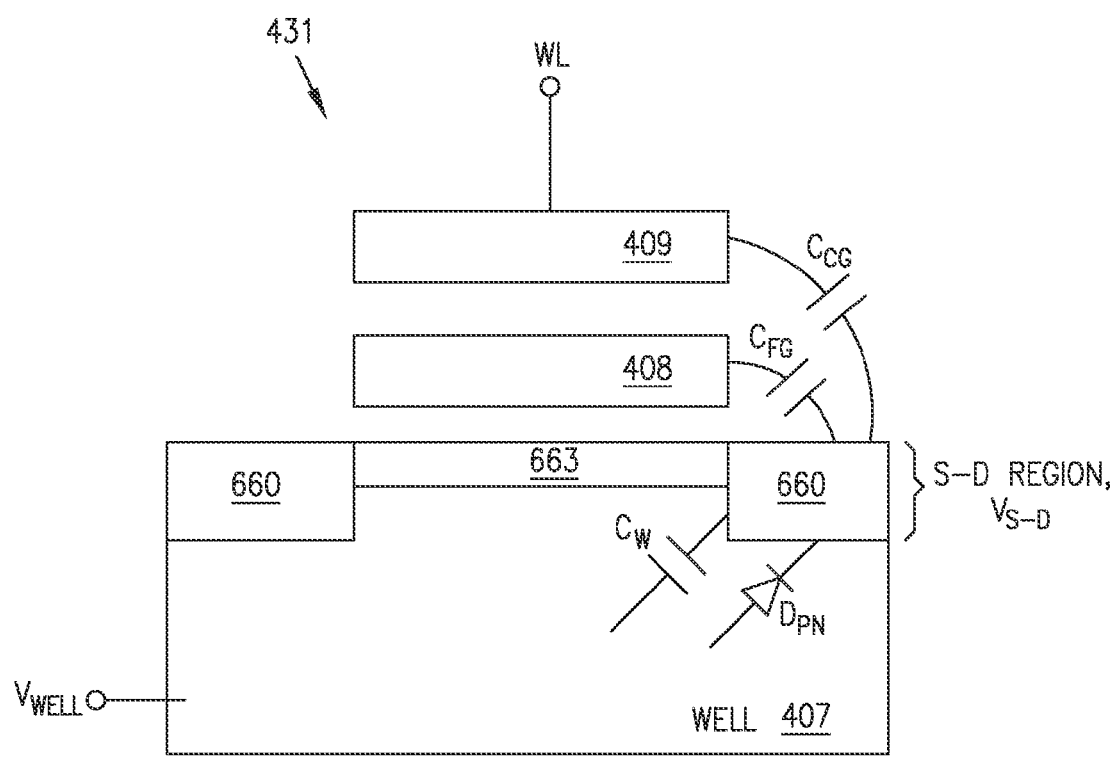
FIG. 6 shows a cross-section of a portion of the memory device of FIG. 4 depicting a portion of a well and a portion of a region of a string of memory cells with capacitive and diode modeling, according to an embodiment of the invention.

During time interval 501, memory device 400 allows BL0, BL1, SL, and the S-D regions of both selected and unselected strings 430 and 431 to "float", such that the voltage levels at these regions also rise in the same direction with the voltage level at well 407. In this description, "to float" or "floating" a component means not holding that component at a fixed voltage level but allowing the voltage level at that component to rise and fall to different voltage levels. As shown in FIG. 5, during time interval 501, the voltage level at each of BL0, BL1, SL, and S-D regions of strings 430 and 431 rises from voltage level V0 to voltage level V3 in response to the voltage level of well 407 rising from V0 to V1. V3 can be less than V1. For example, V3 can be equal to V1 min $V_{DIODE}$ (V1-$V_{DIODE}$), where $V_{DIODE}$ is a voltage across a p-n junction diode between well 407 and the S-D regions of string 430 or 431. FIG. 6 below shows a p-n junction diode ($D_{PN}$) between well 407 and the S-D region of string 431. V1 can be greater than zero and less than the supply voltage (e.g., Vcc) of memory device 400. V1 can also be equal to or greater than the supply voltage of memory device 400. Thus, if V1 is greater than the supply voltage of memory device 400 (e.g., greater than Vcc minus $V_{DIODE}$), V3 can also be greater than the supply voltage memory device 400.

In FIG. 5, during time intervals 501 and 502, memory device 400 raises the voltage levels of SGS and SGD and hold them at voltage levels V4 and V5, respectively. Each of V4 and V5 can have a value equal to a supply voltage of memory device 400 or other value greater than the threshold voltage of each of transistors 415 and 416.

With the voltage levels shown in FIG. 5 during time interval 501, electrons from the S-D regions of strings 430 and 431 move to well 407 and stay therein. Thus, electrons are removed from the S-D regions of strings 430 and 431. As electrons are removed, the amount of electrons in these S-D regions is reduced. Depending on the value of V1 at well 407, the electrons in these S-D regions can be partially removed or completely removed. The amount of electrons moving from these S-D regions is proportional to the difference between V1 and V2. Thus, if V2 is fixed (e.g., fixed at V2 as shown in FIG. 5 during time interval 501), the amount of electrons moving from these S-D regions is proportional to the value of V1, such that the higher the value of voltage level V1, the more electrons are removed from these S-D regions. Reducing the amount of electrons in these S-D regions may leave no free electrons or leave fewer electrons in these S-D regions that may be insufficient to cause programming disturbance. Thus, reducing the amount of electrons in these S-D regions can decrease or suppress programming disturbance that may happen to the unselected strings of memory device 400, such as string 431, when one or more memory cells of one or more selected strings, such as string 430, is programmed (e.g., during time interval 502).

During time interval 502, memory device 400 decouples $V_{WELL}$ from well 407 to decrease the voltage at well 407 from V1 to V0. Memory device 400 may decouple well 407 from $V_{WELL}$ by stopping the charging of well 407 and then discharging well 407 to decrease its voltage level.

During time interval 502, memory device 400 causes the voltage level at BL0 (bit line coupled to selected string) to fall from V3 to a lower voltage level such as V0. Memory device 400 may cause the voltage level at BL0 to fall by coupling BL0 to ground potential. The voltage level of the S-D region of string 430 also falls to V0 when BL0 falls to V0.

During time interval 502, memory device 400 causes the voltage level BL1 (bit line coupled to unselected string) to fall from V3 to a lower voltage level V6. Memory device 400 may cause the voltage level at BL1 to fall by coupling BL1 to the supply voltage of memory device 400. Thus, V6 can be equal to the supply voltage of memory device 400.

During time interval 502, memory device 400 causes SL to fall from V3 to a lower voltage level V8. Memory device 400 may cause the voltage level at SL to fall by coupling SL to the supply voltage of memory device 400. Thus, V8 can be equal to the supply voltage of memory device 400.

Between times T1 and T2, since the S-D region of string 431 is coupled to well 407, voltage level V3 of the S-D region of string 431 also falls to a lower voltage level V7. V7 is greater than V0.

At time T2, memory device 400 raises the voltage level at WL2 (selected word line) from V0 to a higher voltage level V9. V9 can be a programming voltage used to program selected memory cell 411. Since gate 409 of memory cell 411 is coupled to WL2, by raising WL2 to V9, memory device 400 effectively applies V9 to gate 409 of memory cell 411 to change the threshold voltage of memory cell 411 to a value that reflects the value of information stored thereon.

At time T2, memory device 400 also raises the voltage level at WL0, WL1, and WL3 (unselected word line) from V0 to a higher voltage level V10. V10 is less than V9. Since gates 409 of memory cells 410, 412, and 413 are coupled to corresponding WL0, WL1, and WL3, by raising WL0, WL1, and WL3 to V10, memory device 400 effectively applies V10 to gates 409 of memory cells 410, 412, and 413.

At time T2, the voltage level of the S-D region of string 431 also rises from V7 to a higher voltage level V11. Memory cell 411 of string 431 is not programmed because the voltage difference between V9 and V11 of the S-D region of string 431 and is not enough to change the threshold voltage of memory cell 411. Also, memory cells 410, 412 and 413 of string 431 are not programmed because the voltage difference between V10 and V11 of the S-D region of string 431 is not enough to change the threshold voltage of memory cells 410, 412 and 413 of string 431.

After time T3, memory device 400 may reset its components to the levels before time T0.

V11 can be called a boosted voltage level because the voltage level of the S-D region of string 431 (unselected string) during time interval 502 is "boosted" from a relatively lower voltage level V3 or V7. A higher V3 or V10, or both, results in a higher V11. The higher V11, the less programming disturbance can affect unselected strings (e.g., string 431) of memory device 400 when a memory cell in a selected string (e.g., string 430) is programmed. Thus, by increasing the V3 or V10, or both, V11 is also increased, thereby decreasing programming disturbance that may happen to unselected strings of memory device 400. As described above, V3 can be obtained by applying $V_{WELL}$ greater than V2 to well 407 to reduce the amount of electrons in the S-D regions. Thus, V11 can be controlled by controlling the value of $V_{WELL}$. For example, a higher V11 can be obtained by applying $V_{WELL}$ with a higher value.

As described above, V1 and V3 can be equal to or greater than the supply voltage (e.g., Vcc) of memory device 400. Therefore, in memory device 400, higher V11 (to decrease programming disturbance) can be obtained by applying $V_{WELL}$ to well 407 during time interval 501 of the programming operation.

Some conventional memory devices may include region similar to the S-D region of FIG. 3. For the purposed of this description, the region of the conventional memory device similar to the S-D region of FIG. 3 is referred to as a selected substrate region. During a programming operation, a voltage level at the selected substrate region of an unselected string of the convention memory device is obtained by applying a voltage $V_{BL}$ to a bit line (unselected bit line) associated with the unselected string. Then, a select transistor (e.g., transistor coupled to SGD) is turned on and a voltage $V_{WL}$ greater than zero is applied to word lines associated with the unselected string to turn on the transistors of the memory cells of the unselected string. The turned on transistors pass $V_{BL}$ at the unselected bit line to the selected substrate region of the unselected string of the conventional memory device, such that $V_{BL}$ is also present at the selected substrate region of the unselected string. $V_{BL}$ at the selected substrate region of the unselected string of the conventional memory device can be referred to as a seed voltage. $V_{BL}$ at the unselected bit line of the conventional memory device, however, is limited to (e.g., not greater than) the supply voltage (e.g., Vcc) of the conventional memory device. Thus, in the conventional memory device, the seed voltage (which is based on $V_{BL}$) at the selected substrate region is limited to the supply voltage, and $V_{WL}$ greater than zero is applied to the word lines to pass the seed voltage. As a result, in the conventional memory device, there is a trade-off in the seed voltage and a voltage at the selected substrate region in subsequent time interval of the programming operation (e.g., a boosted voltage level) because a higher $V_{WL}$ at the word lines results in a lower voltage level (e.g., lower boosted voltage level) at the selected substrate region in subsequent time interval of the programming operation. A lower boosted voltage level may be insufficient to decrease programming disturbance in the conventional memory device.

Moreover, in a conventional memory device, an increase in the $V_{WL}$ at the word lines beyond a certain value (in an attempt to increase the boosted voltage level) may not result in an increase in a boosted voltage level of the selected substrate region. The reason may be attributed to junction leakage between the reverse bias between the selected substrate region and the surrounding substrate in the conventional memory device, in which the junction leakage may limit the boosted voltage level of the selected substrate region. Therefore, the limitation in the boosted voltage level may also limit any attempt to decrease in programming disturbance in the conventional memory device.

In FIG. 5, since V2 at WL0, WL1, WL2, and WL3 memory device 400 can be zero, thus the level voltage, such as V11, at the unselected string during time interval 502 can be as high as possible, thereby also enhancing the decrease programming disturbance. Further, in FIG. 5, as explained above, a higher V3 or V10, or both, results in a higher V11. Thus, increased V3 may allow decreased V10 for the same V11, thereby reducing or preventing junction leakage between the reverse biased S-D region of string 431 and well 407, thereby leading to decreased programming disturbance.

FIG. 6 shows a cross-section of a portion of memory device 400 of FIG. 4 depicting a portion of well 407 and a portion of the S-D region of string 431 with capacitive and diode modeling, according to an embodiment of the invention. Word line WL in FIG. 6 represents one of word lines WL0, WL1, WL2, and WL1 of FIG. 4. The S-D region of string 431 includes source and drains 660 and a channel 663. As shown in FIG. 6, source and drain 660 are floating, and can be modeled using capacitor $C_{CG}$ coupled to word line WL, capacitor $C_{FG}$ coupled to floating gate 408, capacitor $C_W$ coupled to well 407, and diode $D_{PN}$ coupled between the S-D region and well 407.

The voltage level at the S-D region, $V_{S-D}$, is determined based on $C_{CG}$, $C_{FG}$, $C_W$ and any charge $Q_{S-D}$ as shown in the equation below.

$$V_{S-D} = ((C_{CG}*V_{CG}) + (C_{FG}*V_{FG}) + (C_W*V_{WELL}) + Q_{S-D})/(C_{CG} + C_{FG} + C_W)$$

In the above equation, voltages $V_{CG}$, $V_{FG}$, and $V_{WELL}$ correspond to voltages associated with capacitors $C_{CG}$, $C_{FG}$, and $V_{WELL}$ respectively. Channel 663 my also include electrons when the memory cell associated with the channel has a negative threshold voltage, for example, when the memory cell is in an erased state. Channel 663 can also be modeled in a similar fashion as that of source and drain 660 shown in FIG. 6.

In operation, when $V_{WELL}$ is greater than $V_{S-D}$, diode $D_{PN}$ turns on and electrons move out of the S-D region into well 407. For example, during time interval 501 in FIG. 5 when $V_{WELL}$ rises from V0 to V1, diode $D_{PN}$ turns on when $V_{WELL}$ is greater than $V_{S-D}$. The loss of electrons in the S-D region raises the voltage level of $V_{S-D}$. When $V_{S-D}$ is approximately equal to $V_{WELL}$ minus a voltage (e.g., $V_{DIODE}$) across diode $D_{PN}$, such as V3 in FIG. 5, the diode $D_{PN}$ turns off. The amount of electrons moving out of the S-D region is proportional to $V_{WELL}$.

Thus, during time interval 501 in FIG. 5, a different voltage difference between the well 407 and word line WL is created, causing electrons from the S-D region in FIG. 6 to move out of this region into well 407. Therefore, during time interval 501 in FIG. 5, the amount of electrons in the S-D region is reduced. As described above, reducing the amount of electrons in the S-D regions may decrease or suppress programming disturbance that may happen to the unselected strings, such as string 431.

Figure 7:
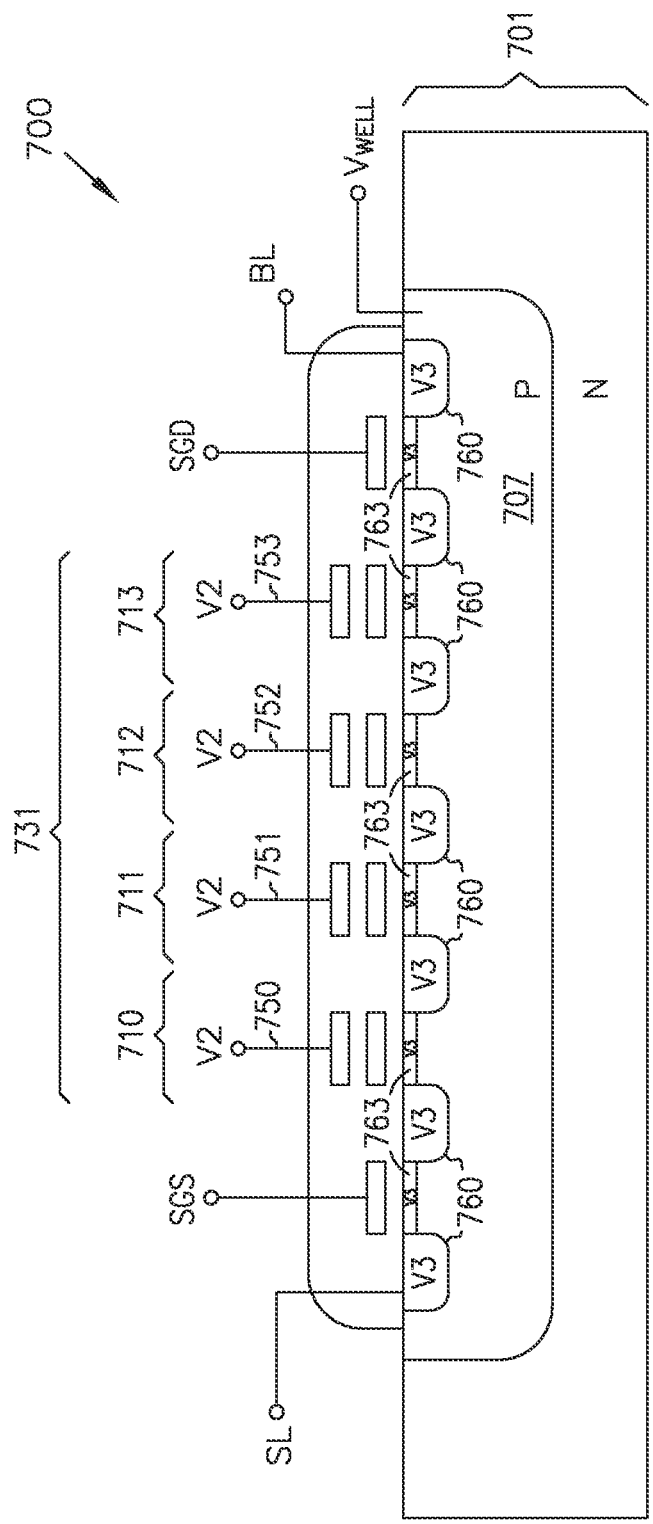
FIG. 7 shows a partial cross-section of a memory device depicting various voltage levels of some components of the memory device during a programming operation of the memory device, according to an embodiment of the invention.

FIG. 7 shows a partial cross-section of memory device 700 depicting various voltage levels of some components of memory device 700, including string 731, during a programming operation of memory device 700, according to an embodiment of the invention. Voltage levels V2, V3, and well 707 in FIG. 7 correspond to V2, V3, and well 407 of FIG. 4 and FIG. 5. String 731 of FIG. 7 can be an unselected string during a programming operation of memory device 700, such as string 431 described above with reference to FIG. 4, FIG. 5, and FIG. 6. In FIG. 7, SL, BL, SGD, and SGS correspond to similar components of FIG. 3.

In FIG. 7, V3 is a positive voltage at the S-D region of string 731 that results from electrons moving out of the S-D region into well 707 when V2 is applied to word lines 750, 751, 752, and 753 and $V_{WELL}$ greater than V2 is applied to well 707 of substrate 701. The S-D region of string 731 includes regions 760 and 763. Since well 707 surrounds the S-D region, an equal amount of electrons from different locations of the S-D region may move to well 707 when $V_{WELL}$ greater than V2 is applied to well 707. Thus, the S-D region may also have an equal voltage (or substantially uniform voltage level) V3 extending through out the S-D region.

Some conventional memory devices may apply a voltage $V_{BL}$ to its bit line and apply a word tine voltage $V_{WL}$ greater than zero to the control gate of the memory cells of the unselected string to turn on transistors of the memory cells of the unselected string, so that $V_{BL}$ from the bit line can be passed to a selected substrate region (similar to the S-D region of FIG. 7) of the conventional memory device. However, in some cases, $V_{WL}$ used in the conventional memory device may be insufficient to turn on a transistor of a particular memory cell because the particular memory cell may be programmed with a value (e.g., threshold voltage) greater than $V_{WL}$. Thus, in the conventional memory device, $V_{BL}$ from the bit line may reach only a portion of the selected substrate region and stop at a location of the selected substrate region where a particular memory cell is programmed with a value greater $V_{WL}$. Thus, some locations of the selected substrate region of the unselected string in the conventional memory device may have a voltage (e.g., 0 volts) that is lower than $V_{BL}$ (e.g., Vcc). Therefore, the voltage level (e.g., boosted voltage level) at the selected substrate region of the unselected string of the conventional memory device is dependent on the values of information stored in the memory cells of the unselected string and may not be as high as possible, thereby decreasing programming disturbance in the conventional memory device.

In memory device 700, however, since V3 results from application of $V_{WELL}$ to well 707, the voltage level at the S-D region is independent of the values stored in memory cells 710, 711, 712, and 713. Therefore, V3 in the S-D region of string 731 and can reach all locations in the S-D region, thereby allowing the voltage level (e.g., V11) at the S-D region to be as high as possible during a time interval, such as time interval 502 of the programming operation. When a voltage level (similar to V11 of FIG. 5) of memory device 700 can be as high as possible during a programming operation, programming disturbance that may happen to unselected string 731 may be decreased in ways similar to those described above with reference to FIG. 4 and FIG. 5.

One or more embodiments described herein include methods and devices having a module and memory cells. The module is configured to reduce the amount of electrons in the sources and drains of the memory cells during a programming operation to decrease programming disturbance to improve the programming operation. Other embodiments including additional methods and devices are described above with reference to FIG. 1 through FIG. 7.

The illustrations of apparatus such as memory devices 100, 200, 400, and 700 are intended to provide a general understanding of the structure of various embodiments and not a complete description of all the elements and features of the apparatus that might make use of the structures described herein.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
    memory cells located in a substrate;
    a select transistor coupled to the memory cells; and
    a module configured to apply first positive voltage to a portion of the substrate during a first time interval of a programming operation, to apply a second positive voltage to a gate of the select transistor during the first time interval, and to program at least one of the memory cells during a second time interval of the programming operation.

2. The apparatus claim 1, further comprising an additional select transistor coupled to the memory cells, wherein the module is configured to apply a positive voltage to a gate of the additional select transistor during the first time interval.

3. The apparatus of claim 1, wherein the module is configured to hold gates of the memory cells at zero volts during the first time interval.

4. The apparatus of claim 1, wherein the module is configured to hold gates of the memory cells at a voltage level less than the first positive voltage during the first time interval.

5. The apparatus of claim 1, wherein the apparatus comprises a memory device, the memory cells being part of the memory device.

6. The apparatus of claim 1, wherein the module includes a voltage generator.

7. The apparatus of claim 1, wherein the module includes a control circuit.

8. The apparatus of claim 1, therein the module includes a voltage generator and a control circuit.

9. A method comprising:
applying a first positive voltage to a portion of a substrate of a device during a first time interval a programming operation of the device;
applying a second positive voltage, during the first time interval, to a gate of at least one select transistor coupled to memory cells of the device; and
programming at least one of the memory cells during a second tine interval of the programming operation.

10. The method of claim 9, further comprising:
creating a voltage difference between gates of the memory cells and the portion of the substrate, such that a voltage level at the portion of the substrate is greater than a voltage level at each of the gates during the first time interval.

11. The method of claim 9, further comprising:
holding a voltage level at gates of the memory cells at zero volts during the first time interval.

12. The method of claim 9, further comprising:
floating sources and drains and of the memory cells during the first time interval.

13. A method comprising:
applying a first voltage to a plurality of gates of memory cells in a string of a device during a first time interval of a programming operation of the device;
applying a second voltage to a first gate of a first memory cell and a second gate of a second memory cell of the plurality of gates of memory cells during a second time interval of the programming operation;
applying a third voltage to a third gate of a third memory cell of the plurality of gates of memory cells during the second time interval; and
applying a positive voltage to a portion of a substrate coupled to the string of memory cells during the first time interval.

14. The method of claim 13, further comprising:
decreasing the positive voltage during the second time interval.

15. The method of claim 13, wherein the first voltage has a voltage level less than a voltage level of the positive voltage.

16. The method of claim 15, wherein the first voltage has a voltage level equal to zero volts.

17. The method of claim 15, wherein the first voltage has a negative value.

18. The method of claim 13, further comprising:
floating a bit line coupled to the memory cells of the string.

19. The method of claim 18, further comprising:
decreasing a voltage at the bit line during the second time interval.

20. The method of claim 13, wherein one of the memory cells of the string is selected to be programmed during the programming operation.

* * * * *

UNITED STATES PATENT AND TRADEMARK OFFICE
CERTIFICATE OF CORRECTION

PATENT NO. : 8,705,290 B2  
APPLICATION NO. : 13/621052  
DATED : April 22, 2014  
INVENTOR(S) : Prashant S. Damle et al.

Page 1 of 1

It is certified that error appears in the above-identified patent and that said Letters Patent is hereby corrected as shown below:

In the Claims:

In column 10, line 66, in Claim 1, delete "apply" and insert -- apply a --, therefor.

In column 11, line 6, in Claim 2, after "apparatus" insert -- of --.

In column 11, line 23, in Claim 8, delete "therein" and insert -- wherein --, therefor.

In column 11, line 33, in Claim 9, delete "tine" and insert -- time --, therefor.

Signed and Sealed this
Twenty-second Day of July, 2014

Michelle K. Lee
*Deputy Director of the United States Patent and Trademark Office*